United States Patent
Pu et al.

(10) Patent No.: US 10,581,441 B2
(45) Date of Patent: Mar. 3, 2020

(54) APPARATUS AND METHOD FOR GENERATING CLOCK SIGNAL WITH LOW JITTER AND CONSTANT FREQUENCY WHILE CONSUMING LOW POWER

(71) Applicant: QUALCOMM Incorporated, San Diego, CA (US)

(72) Inventors: Yu Pu, San Diego, CA (US); Jongrit Lerdworatawee, Santee, CA (US); Chunlei Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 130 days.

(21) Appl. No.: 15/706,449

(22) Filed: Sep. 15, 2017

(65) Prior Publication Data

US 2019/0089364 A1    Mar. 21, 2019

(51) Int. Cl.
*H03L 7/06* (2006.01)
*H03L 7/187* (2006.01)
(Continued)

(52) U.S. Cl.
CPC ........ *H03L 7/187* (2013.01); *G01R 31/31709* (2013.01); *H02M 3/33546* (2013.01);
(Continued)

(58) Field of Classification Search
CPC ..... H03L 7/187; H03L 7/0994; H03L 7/1976; H03L 7/07; H03L 7/0998; G01R 31/31709; H02M 3/33546
(Continued)

(56) References Cited

U.S. PATENT DOCUMENTS

| 4,963,840 A | 10/1990 | Thommen |
| 6,914,494 B1 * | 7/2005 | Chen ............... H03K 3/012 331/111 |

(Continued)

OTHER PUBLICATIONS

NXP ultra-low-power RTC/calendars PCF8523 & PCF2123, "Save power with small, ultra-efficient RTCs", 2011, NXP Semiconductors N.V., 2 Pages.

(Continued)

*Primary Examiner* — Metasebia T Retebo
(74) *Attorney, Agent, or Firm* — Loza & Loza, LLP/Qualcomm

(57) ABSTRACT

A clock signal generator includes ramp and threshold voltage generators. The clock signal generator further includes a comparator configured to initiate a first phase of a clock signal based on the ramp and threshold voltages applied to its first and second inputs, respectively. The comparator is further configured to initiate a second phase of the clock signal based on the ramp and threshold voltages applied to its second and first inputs, respectively. Because the application of the ramp and threshold voltages to the inputs of the comparator is swapped per phase of the clock signal, any offset voltage in the comparator does not affect the period of the clock signal because they cancel out after two-half periods. This ensures that the clock signal has a substantially constant frequency. Other features include enabling the high power consuming comparator during a small window to achieve low jitter and low average power consumption.

28 Claims, 4 Drawing Sheets

(51) Int. Cl.
*H03L 7/07* (2006.01)
*H03L 7/197* (2006.01)
*G01R 31/317* (2006.01)
*H03L 7/099* (2006.01)
*H02M 3/335* (2006.01)
*H03K 3/0231* (2006.01)

(52) U.S. Cl.
CPC ............ *H03K 3/0231* (2013.01); *H03L 7/07* (2013.01); *H03L 7/0994* (2013.01); *H03L 7/0998* (2013.01); *H03L 7/1976* (2013.01); *G01R 31/31727* (2013.01)

(58) Field of Classification Search
USPC .......................................... 327/156; 331/143
See application file for complete search history.

(56) References Cited

U.S. PATENT DOCUMENTS

| | | | |
|---|---|---|---|
| 8,054,141 B2 | 11/2011 | Saw | |
| 8,508,306 B2 | 8/2013 | Choe et al. | |
| 9,214,927 B2 | 12/2015 | Wang | |
| 9,362,922 B2 | 6/2016 | Schatzberger | |
| 9,385,692 B2 | 7/2016 | Blaauw et al. | |
| 2011/0001572 A1* | 1/2011 | Shahparnia | H03K 3/0231 331/111 |
| 2013/0106385 A1* | 5/2013 | Smith, Jr. | H02M 3/1588 323/288 |
| 2013/0222069 A1* | 8/2013 | Paidimarri | H03B 5/24 331/47 |
| 2013/0307525 A1* | 11/2013 | Chen | G01R 17/10 324/101 |
| 2014/0375392 A1* | 12/2014 | Sinitsky | H03K 3/0231 331/111 |
| 2017/0040944 A1* | 2/2017 | Satoh | G06F 1/04 |

OTHER PUBLICATIONS

Paidimarri A., et al., "A 120nW 18.5kHz RC Oscillator with Comparator Offset Cancellation for ±0.25% Temperature Stability", IEEE International Solid-State CircuitsConference, Digest of Technical Papers (ISSCC), Feb. 2013, pp. 184-185.

* cited by examiner

APPARATUS AND METHOD FOR GENERATING CLOCK SIGNAL WITH LOW JITTER AND CONSTANT FREQUENCY WHILE CONSUMING LOW POWER

FIELD

Aspects of the present disclosure relate generally to clock generators, and in particular, to an apparatus and method for generating a clock signal with low jitter and constant frequency while consuming low power.

BACKGROUND

A clock signal generator is used to generate a clock signal from which various circuit functions depend. For example, the clock signal may be used in time-sensitive circuits, such as wake-up circuits, for initiating an operation based on a time parameter. In such circuits, the time parameter depends on the clock signal. For performance purposes, it is desired that the clock signal generator consume minimal power while generating a clock signal with low jitter and constant frequency.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a clock generator configured to generate a clock signal; and a comparator configured to generate a signal at a first logic level to initiate the clock generator to generate a first phase of the clock signal based on a ramp voltage and a reference voltage at first and second inputs of the comparator, respectively, and generate the signal at a second logic level to initiate the clock generator to generate a second phase of the clock signal based on the ramp voltage and the reference voltage at the second and first inputs of the comparator, respectively.

Another aspect of the disclosure relates to a method including generating a first signal based on a ramp voltage and a reference voltage at first and second nodes, respectively; generating a second signal based on the ramp voltage and the reference voltage at the second and first nodes, respectively; generating a first phase of a clock signal in response to the first signal; and generating a second phase of the clock signal in response to the second signal.

Another aspect of the disclosure relates to apparatus including means for generating a first signal based on a ramp voltage and a reference voltage at first and second nodes, respectively, wherein the means for generating the first signal is configured to generate a second signal based on the ramp voltage and the reference voltage at the second and first nodes, respectively; and means for generating a first phase of a clock signal in response to the first signal, wherein the means for generating the first phase of the clock signal is configured to generate a second phase of the clock signal in response to the second signal.

To the accomplishment of the foregoing and related ends, the one or more embodiments include the features herein-after fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Wearable medical devices often are configured to perform a medical measurement and/or therapy on patients based on a predefined schedule. These devices typically include a wake up circuit that generates interrupts according to the predefined schedule so that the measurement and/or therapy are administered during the appropriate times. Other devices, such as smart phones, also use wake up circuits to effectuate time-based operations.

Figure 1:
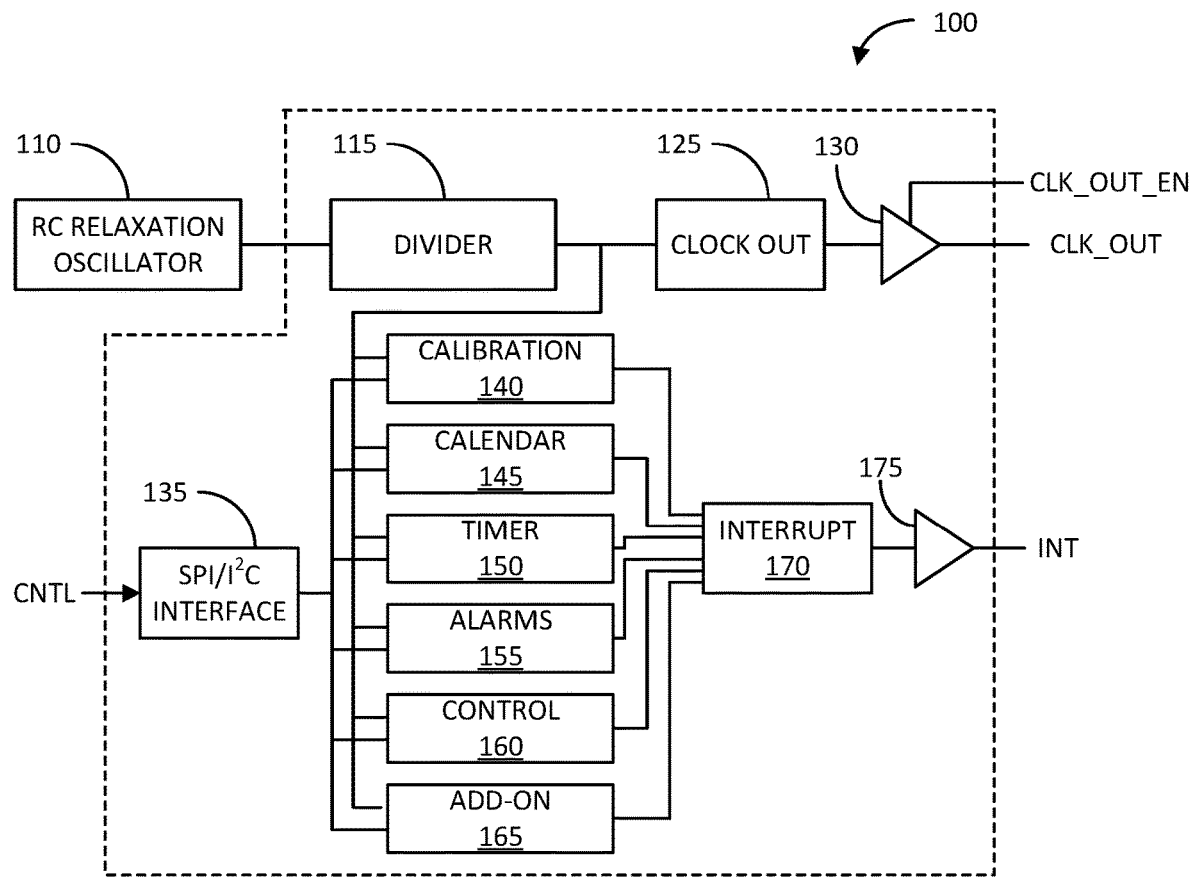
FIG. 1 illustrates a block diagram of an exemplary wake up circuit in accordance with an aspect of the disclosure.

FIG. 1 illustrates a block diagram of an exemplary wake up circuit 100 in accordance with an aspect of the disclosure. The wake up circuit 100 includes a resistor-capacitor (RC) relaxation oscillator 110, a frequency divider 115, a clock out 125, and a clock output driver 130. The wake up circuit 100 further includes a digital control interface 135 (e.g., Serial Peripheral Interface (SPI) or Inter-Integrated Circuit ($I^2C$)), and a set of time-based functional units, such as a calibration unit 140, a calendar unit 145, a timer unit 150, alarms unit 155, a control unit 160, and an add-on unit 165. The wake up circuit 100 additionally includes an interrupt-generating device 170 and an interrupt output driver 175.

The RC relaxation oscillator 110 generates a substantially-periodic or clock signal (referred to in FIG. 1 as a "base clock signal"). The frequency divider 115 frequency divides the base clock signal to generate an operational clock signal at a desired frequency. The operational clock signal is applied to respective inputs of the set of time-based functional units 140-165. The operational clock signal may also be outputted as CLK_OUT via the clock out 125 and clock output driver 130 in response to a clock output enable signal CLK_OUT_EN applied to a control input of the output driver 130.

The digital control interface 135 receives a control signal CNTL, which may be generated by a central processing unit (CPU) core of a system on chip (SOC) type integrated circuit (IC) in response to a user interface. Based on the control signal CNTL, the digital control interface 135 programs any one or more of the set of time-based functional units 140-165. Thus, based on the operational clock signal received from the divider 115 and the programming instruction from the digital control interface 135, one or more of the set of time-based functional units 140-165 generate time-based signals to initiate an interrupt. In response to the interrupt-initiating signal, the interrupt-generating device 170 generates an interrupt (INT), which is outputted via the output driver 175, for use by other devices (e.g., a medical monitoring and/or therapy administering device) to perform the desired operation at such time.

As illustrated, the components enclosed by the dashed line operate in the digital domain. Thus, these devices generally do not consume significant power. However, the RC relaxation oscillator operates in the analog domain, and typically consumes significant power. Further, for generating the interrupts at precise times, the frequency of the base clock signal generated by RC relaxation oscillator 110 should be precisely controlled. This includes the reduction or minimizing of jitter (i.e., variation in the periodicity of the substantially-periodic signal).

For RC relaxation oscillators, the jitter $$\left(\frac{\sigma}{T_0}\right)$$

may be determined in accordance with the following equation:

$$\frac{\sigma}{T_0} = K_c \sqrt{\frac{1}{I_c \cdot V_{headroom}}} + \sqrt{\frac{K_{i1}}{V_{ramp}^2 I_{comp}^2} + \frac{K_{i2}}{V_{ramp}^2}}$$

Where σ is the period variation, $T_0$ is the mean period, $V_{headroom}$ is the voltage difference between a supply voltage $V_{DD}$ and voltage levels at the inputs of a comparator, $V_{ramp}$ is a maximum ramp voltage, $I_c$ is a current used for generating the ramp voltage, $I_{comp}$ is a supply current for the comparator, and $K_c$, $K_{i1}$, and $K_{i2}$ are constants.

As the above equation illustrates, the jitter $$\left(\frac{\sigma}{T_0}\right)$$

is reduced by increasing the power consumption of the oscillator 110 (i.e., by increasing $I_C$, $I_{comp}$, $V_{headroom}$ and/or $V_{ramp}$).

Thus, RC relaxation oscillators, which have been specifically designed for low jitter (i.e., high timing accuracy), suffer from consuming substantial amount of power. Other RC relaxation oscillators, which have been specifically designed for low power consumption, suffer from high jitter (i.e., high timing accuracy compromised). Thus, there is a need for a low jitter and low power RC relaxation oscillator.

In summary, some main concepts of this disclosure include: (1) swap a ramp voltage $V_{RAMP}$ and threshold voltage $V_{TH}$ at inputs of a comparator of an RC relaxation oscillator per each half-period of a clock signal so that any offset voltage present in the comparator cancels out for each period of the clock signal, thereby achieving a substantially constant period or frequency; (2) supply sufficient power to the comparator to reduce jitter and achieve precise periodicity of the generated clock signal; and (3) only enable the comparator during a small portion of each period of the clock signal in order to reduce the average power consumption of the oscillator. These concepts are further explained with reference to the following exemplary embodiments.

Figure 2:
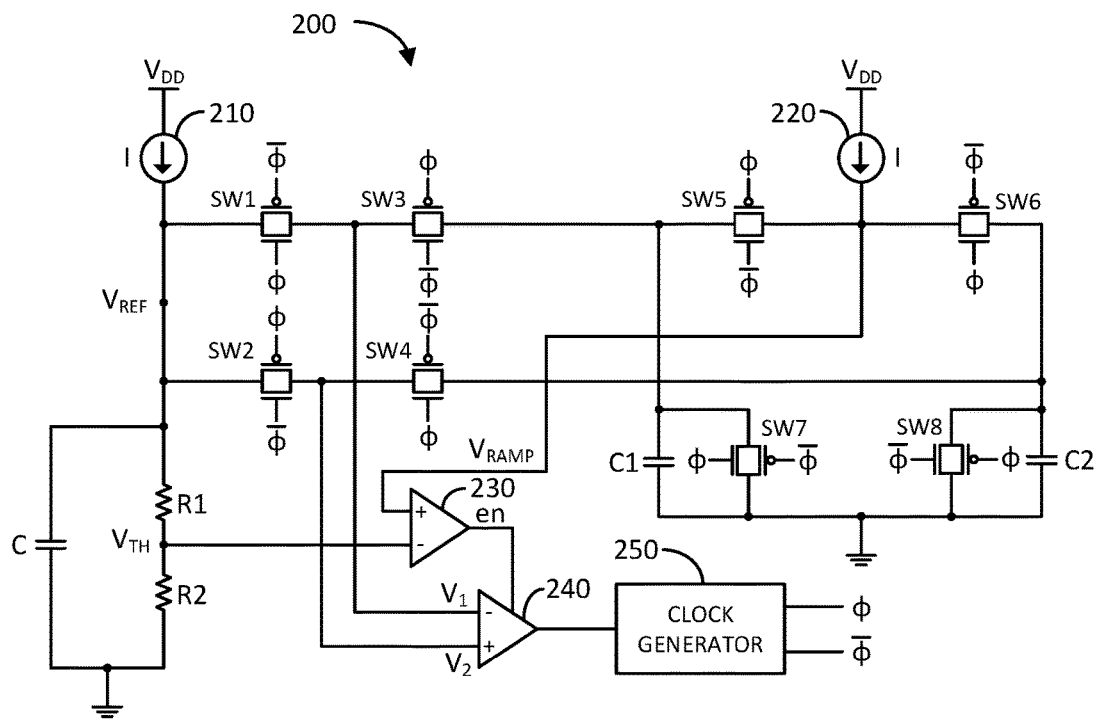
FIG. 2 illustrates a schematic diagram of an exemplary RC relaxation oscillator in accordance with another aspect of the disclosure.

FIG. 2 illustrates a schematic diagram of an exemplary RC relaxation oscillator 200 in accordance with another aspect of the disclosure. The RC relaxation oscillator 200 may be an exemplary detailed implementation of the RC relaxation oscillator 110.

In particular, the RC relaxation oscillator 200 includes a combined reference and threshold voltage generator including current source 210 coupled in series with first and second resistors R1 and R2 between an upper voltage rail $V_{DD}$ and a lower voltage rail (e.g., ground). The combined reference and threshold voltage generator further includes a capacitor C across the series-connected first and second resistors R1 and R2. A substantially constant reference voltage $V_{REF}$ is generated at a node between the current source 210 and resistor R1. A substantially constant threshold voltage $V_{TH}$ is generated at a node between the first and second resistors R1 and R2.

The RC relaxation oscillator 200 further includes a ramp voltage generator including current source 220, switching devices SW5-SW8 (e.g., each configured as a transmission gate), a first capacitor C1, and a second capacitor C2. The current source 220 is coupled between the upper voltage rail VDD and respective first terminals of switching devices SW5 and SW6. As discussed in more detail herein, a ramp voltage $V_{RAMP}$ is generated at the first terminals of the switching devices SW5 and SW6.

The first capacitor C1 is coupled between a second terminal of the switching device SW5 and ground. The switching device SW7 includes first and second terminals coupled across the first capacitor C1. Similarly, the second capacitor C2 is coupled between a second terminal of the switching device SW6 and ground. The switching device SW8 includes first and second terminals coupled across the second capacitor C2. The first capacitor C1, second capacitor C2, and capacitor C may be configured to have the same capacitance.

The switching devices SW6 and SW7 each includes non-complementary and complementary control inputs configured to receive the non-complementary phase Φ and complementary phase $\overline{\Phi}$ of a clock signal, respectively. The switching devices SW5 and SW8 each includes non-complementary and complementary control inputs configured to receive the complementary phase $\overline{\Phi}$ and non-complementary phase Φ of the clock signal, respectively.

The RC relaxation oscillator 200 further includes an enabling comparator 230 including a positive input terminal configured to receive the ramp voltage $V_{RAMP}$, and a negative input terminal configured to receive the threshold voltage $V_{TH}$. Additionally, the RC relaxation oscillator 200 includes a main comparator 240 including a negative input terminal configured to receive a first voltage $V_1$ (which is the reference voltage $V_{REF}$ during $\Phi=1$ ($\overline{\Phi}=0$) of the clock signal, and the ramp voltage $V_{RAMP}$ during $\Phi=0$ ($\overline{\Phi}=1$) of the clock signal). The main comparator 240 also includes a positive input terminal configured to receive a second voltage $V_2$ (which is the ramp voltage $V_{RAMP}$ during $\Phi=1$ ($\overline{\Phi}=0$) of the clock signal, and the reference voltage $V_{REF}$ during $\Phi=0$ ($\overline{\Phi}=1$) of the clock signal).

The enabling comparator 230 includes an output configured to produce an enabling signal en for enabling the main comparator 240. If the enabling signal en is deasserted, the main comparator 240 does not perform the normal comparison operation and consumes relatively small amount of power, if any. If the enabling signal en is asserted, the main comparator 240 performs the normal comparison operation and consumes significant power in doing so, so as to reduce jitter in the clock signal. The main comparator 240 includes an output coupled to a clock generator 250 which, in turn, produces the non-complementary and complementary phases $\Phi$ and $\overline{\Phi}$ of the clock signal in response to a phase-initiating signal generated by the main comparator 240.

The RC relaxation oscillator 200 further includes a set of configuration switching devices SW1-SW4 (each may be configured as a transmission gate) for routing the ramp voltage $V_{RAMP}$ and reference voltage $V_{REF}$ to the inputs of the main comparator 240 based on the current phase of the clock signal. For example, if the current phase of the clock signal is $\Phi=1$ ($\overline{\Phi}=0$), the set of configuration switching devices SW1-SW4 route the ramp voltage $V_{RAMP}$ and reference voltage $V_{REF}$ to the positive and negative input terminals of the main comparator 240, respectively. If the current phase of the clock signal is $\Phi=0$ ($\overline{\Phi}=1$), the set of configuration switching devices SW1-SW4 route the ramp voltage $V_{RAMP}$ and reference voltage $V_{REF}$ to the negative and positive input terminals of the main comparator 240, respectively.

The switching devices SW1 and SW2 include respective first terminals coupled to the node between the current source 210, and second terminals coupled to the negative and positive input terminals of the main comparator 240, respectively. The switching devices SW3 and SW4 include respective first terminals coupled to the respective second terminals of the switching devices SW5 and SW6, and second terminals coupled to the negative and positive input terminals of the main comparator 240, respectively.

The switching devices SW1 and SW4 each includes non-complementary and complementary control inputs configured to receive the non-complementary phase $\Phi$ and complementary phase $\overline{\Phi}$ of the clock signal, respectively. The switching devices SW2 and SW3 each includes non-complementary and complementary control inputs configured to receive the complementary phase $\overline{\Phi}$ and non-complementary phase $\Phi$ of the clock signal, respectively.

The operation of the RC relaxation oscillator 200 is discussed as follows with reference to FIGS. 3A-3B and 4.

Figure 3A:
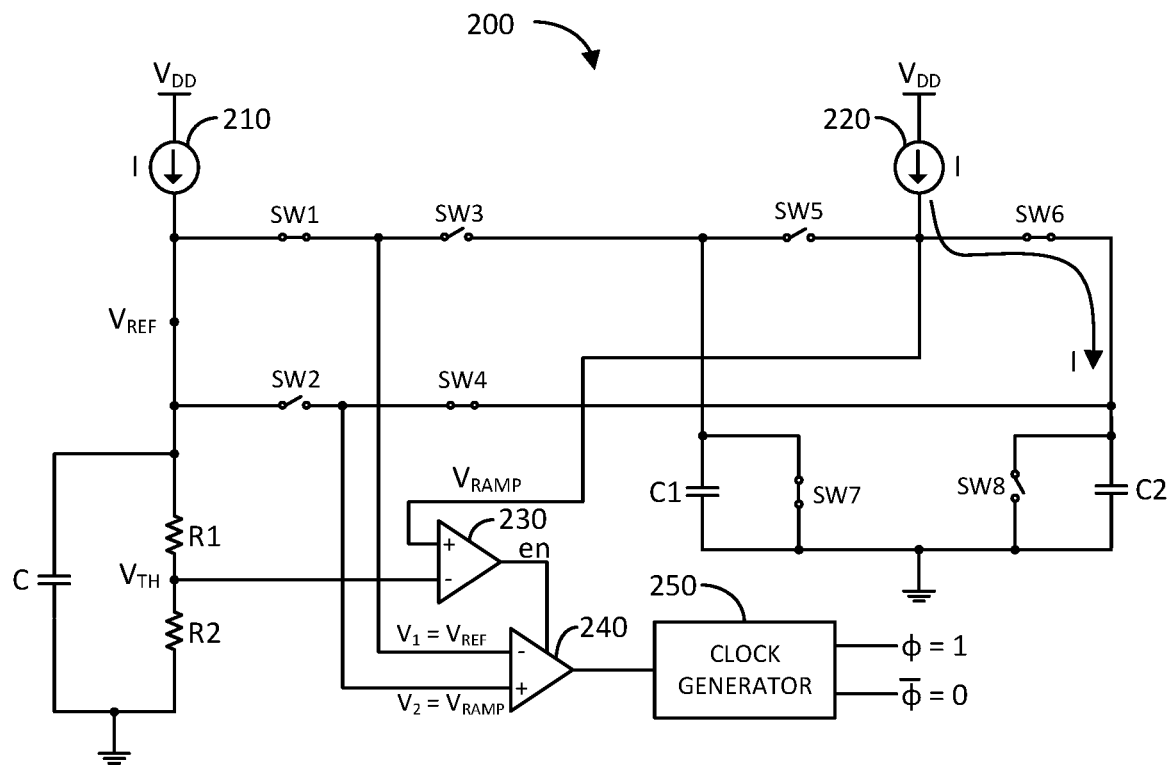
FIG. 3A illustrates a block diagram of the exemplary RC relaxation oscillator of FIG. 2 as configured during the phase $\Phi=1$ ($\overline{\Phi}=0$) of a clock signal in accordance with another aspect of the disclosure.

FIG. 3A illustrates a block diagram of the exemplary RC relaxation oscillator 200 as configured during the phase $\Phi=1$ ($\overline{\Phi}=0$) of the clock signal in accordance with another aspect of the disclosure. During this phase, the switching devices SW1, SW4, SW6, and SW7 are on or closed, and the switching devices SW2, SW3, SW5, and SW8 are off or open.

The closed switching device SW6 allows the current source 220 to charge the second capacitor C2 with a current I to generate the ramp voltage $V_{RAMP}$. The ramp voltage $V_{RAMP}$ is applied to the positive input of the main comparator 240 as voltage $V_2$ via the closed switching device SW4. The closed switching device SW1 causes the reference voltage $V_{REF}$ to be applied to the negative input of the main comparator 240 as voltage $V_1$. The closed switching device SW7 causes capacitor C1 to discharge during this phase.

The open switching device SW5 isolates the current source 220 (and consequently, the ramp voltage $V_{RAMP}$) from ground via closed switching device SW7. Similarly, the open switching device SW3 isolates the reference voltage $V_{REF}$ from ground. The switching device gate SW8 allows the second capacitor C2 to be charged by the current I. And, the open switching device SW2 decouples or electrically isolates the positive terminal ($V_2=V_{RAMP}$) from the negative terminal ($V_1=V_{REF}$) of the main comparator 240.

Figure 4:
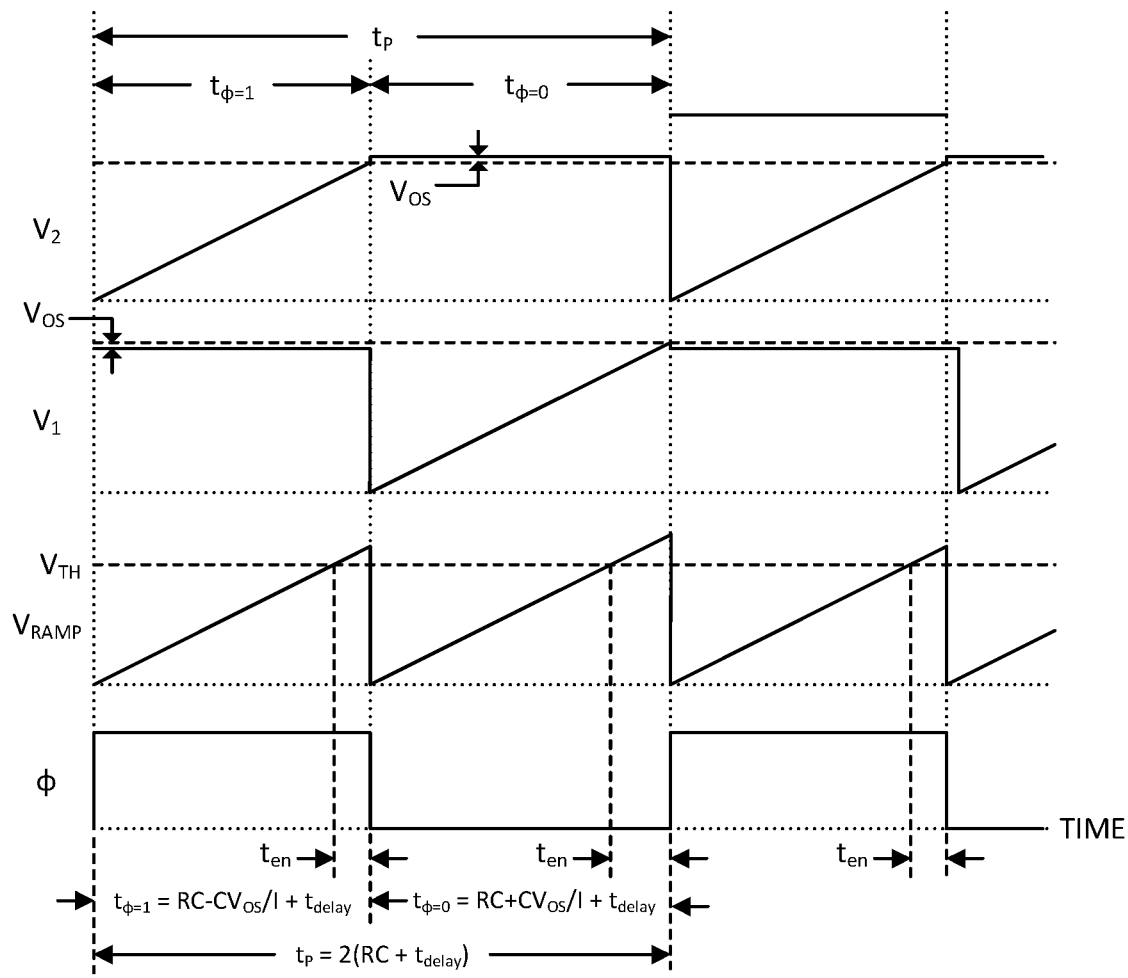
FIG. 4 illustrates a timing diagram of exemplary signals associated with the RC relaxation oscillator of FIG. 2 in accordance with another aspect of the disclosure.

With reference to a timing diagram depicted in FIG. 4, during the $\Phi=1$ ($\overline{\Phi}=0$) as indicated by the first (left-most) column of the timing diagram, the voltage $V_2$ (which is the ramp voltage $V_{RAMP}$ during this phase) increases from substantially zero (0) Volt as a result of charging of the second capacitor C2 by the current source 220.

When the ramp voltage $V_{RAMP}$ reaches or exceeds the threshold voltage $V_{TH}$, the enabling comparator 230 asserts the enable signal (en) to enable the main comparator 240. The enabling comparator 230 is a relatively low power consumption device, whereas the main comparator 240 is a relatively high power consumption device. If, for example, the threshold voltage $V_{TH}$ is set to be approximately 90% of the reference voltage $V_{REF}$ (e.g., R2/(R1+R2)=0.9), then the main comparator 240 is only enabled for 10% during this phase. Thus, this significantly reduces the average power consumption of the RC relaxation oscillator 200.

When the voltage $V_2$ (i.e., $V_{RAMP}$) reaches or exceeds $V_1$ (i.e., $V_{REF}$), the main comparator 240 transitions its output from a low logic voltage to a high logic voltage. In response to the high logic voltage, the clock generator 250 generates the $\Phi=0$ ($\overline{\Phi}=1$) phase of the clock signal.

Figure 3B:
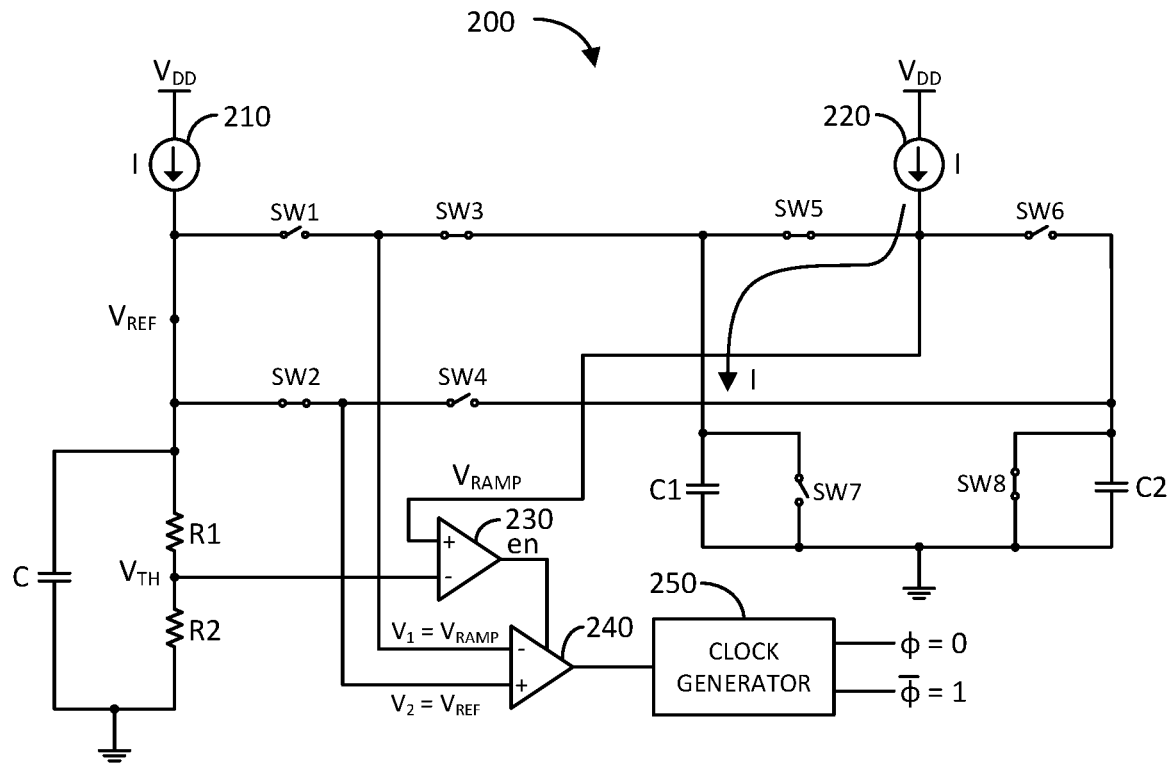
FIG. 3B illustrates a block diagram of the exemplary RC relaxation oscillator of FIG. 2 as configured during the phase $\Phi=0$ ($\overline{\Phi}=1$) of the clock signal in accordance with another aspect of the disclosure.

FIG. 3B illustrates a block diagram of the exemplary RC relaxation oscillator 200 as configured during the phase $\Phi=0$ ($\overline{\Phi}=1$) of the clock signal in accordance with another aspect of the disclosure. During this phase, the switching devices SW2, SW3, SW5, and SW8 are on or closed, and the switching devices SW1, SW4, SW6, and SW7 are off or open.

The closed switching device SW5 allows the current source 220 to charge the first capacitor C1 with a current I to generate the ramp voltage $V_{RAMP}$. The ramp voltage $V_{RAMP}$ is applied to the negative input of the main comparator 240 as voltage $V_1$ via the closed switching device SW3. The closed switching device SW2 causes the reference voltage $V_{REF}$ to be applied to the positive input of the main comparator 240 as voltage $V_2$. The closed switching device SW8 causes the second capacitor C2 to discharge during this phase.

The open switching device SW6 isolates the current source 220 (and consequently, the ramp voltage $V_{RAMP}$) from ground via the closed switching device SW8. Similarly, the open switching device SW4 isolates the reference voltage $V_{REF}$ from ground. The open switching device SW7 allows the first capacitor C1 to be charged by the current I. And, the open switching device SW1 decouples or electrically isolates the negative terminal ($V_1=V_{RAMP}$) from the positive terminal ($V_2=V_{REF}$) of the main comparator 240.

With reference again to the timing diagram depicted in FIG. 4, during the $\Phi=0$ ($\overline{\Phi}=1$) as indicated by the second (from the left) column of the timing diagram, the voltage $V_1$ (which is the ramp voltage $V_{RAMP}$ during this phase)

increases from substantially zero (0) Volt as a result of charging of the first capacitor C1 by the current source 220.

When the ramp voltage $V_{RAMP}$ reaches or exceeds the threshold voltage $V_{TH}$, the enabling comparator 230 asserts the enable signal (en) to enable the main comparator 240. As mentioned, the enabling comparator 230 is a relatively low power consumption device, whereas the main comparator 240 is a relatively high power consumption device. If, for example, the threshold voltage $V_{TH}$ is set to be approximately 90% of the reference voltage $V_{REF}$ (e.g., R2/(R1+R2)=0.9), then the main comparator 240 is only enabled for 10% during this phase. Thus, this significantly reduces the average power consumption of the RC relaxation oscillator 200.

When the voltage $V_1$ (i.e., $V_{RAMP}$) reaches or exceeds $V_2$ (i.e., $V_{REF}$), the main comparator 240 transitions its output from a high logic voltage to a low logic voltage. In response to the logic low voltage, the clock generator 250 generates the $\Phi=1$ ($\overline{\Phi}=0$) phase of the clock signal.

With continued reference to FIG. 4, if there is no offset voltage ($V_{OS}=0$) associated with the main comparator 240, the duration of each of the phases is $RC+t_{delay}$, where R is the sum of the resistances of R1 and R2, C is the capacitance of capacitor C, and $t_{delay}$ is the delay between the ramp voltage $V_{RAMP}$ reaching the reference voltage $V_{REF}$, and the clock generator 250 responsively initiating the next phase.

If there is an offset voltage $V_{OS}$ associated with the main comparator 240, the duration of one of the phases will be increased by an amount of $C*V_{OS}/I$, and the duration of the other phase will be decreased by $C*V_{OS}/I$. However, the period $t_p$ of the substantially-periodic signal remains substantially unaffected by the offset voltage $V_{OS}$ as the duration increase of one of the phases cancels out with the duration decrease of the other phase. That is, the period $t_p$ is maintained stable at substantially $2*(RC+t_{delay})$.

In the example depicted in FIG. 4, the offset voltage $V_{OS}$ favors the voltage $V_2$ at the positive input of the main comparator 240 over the voltage $V_1$ at the negative input of the main comparator 240. Thus, in this example, the duration of phase $\Phi=1$ ($\overline{\Phi}=0$) is shorter than the duration of phase $\Phi=0$ ($\overline{\Phi}=1$) (i.e., $t_{\Phi=1}=RC-CV_{OS}/I+t_{delay}<t_{delay}<t_{\Phi=0}=RC+CV_{OS}/I+t_{delay}$).

Thus, because the offset voltage $V_{OS}$ of the main comparator 240 does not affect the period of the clock signal, the RC relaxation oscillator 200 is able to generate a clock signal with a substantially constant frequency. Additionally, because the main comparator 240 may be configured to consume significant power, the RC relaxation oscillator 200 Is able to generate a clock signal with reduced jitter. Further, because the enabling comparator 230 enables the main comparator 240 when the ramp voltage $V_{RAMP}$ reaches or exceeds the threshold voltage $V_{TH}$, the main comparator 240 consumes power only during a small portion of the period of the clock signal. Thus, the average power consumption of the RC relaxation oscillator 200 is relatively small.

Figure 5:
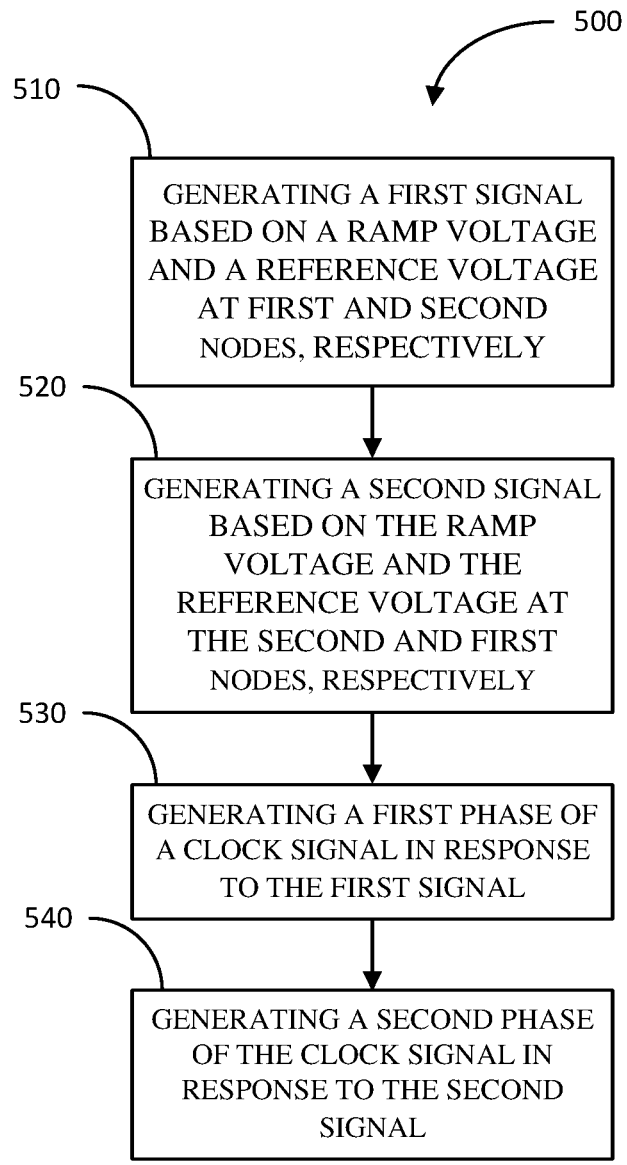
FIG. 5 illustrates a flow diagram of an exemplary method of generating a clock signal in accordance with another aspect of the disclosure.

FIG. 5 illustrates a flow diagram of another exemplary method 500 of generating a clock signal in accordance with another aspect of the disclosure.

The method 500 includes generating a first signal based on a ramp voltage and a reference voltage at first and second nodes, respectively (block 510). The method 500 further includes generating a second signal based on the ramp voltage and the reference voltage at the second and first nodes, respectively (block 520). An example of means for generating the first and second signals includes the comparator 240.

The method 500 also includes generating a first phase of a clock signal in response to the first signal (block 530). Additionally, the method 500 includes generating a second phase of the clock signal in response to the second signal (block 540). An example of means for generating the first and second phases of the clock signal includes the clock generator 250.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
    a clock generator configured to generate a clock signal;
    a first comparator configured to:
        generate a signal at a first logic level to initiate the clock generator to generate a first phase of the clock signal based on a ramp voltage at a first input of the first comparator and a reference voltage at a second input of the first comparator; and
        generate the signal at a second logic level to initiate the clock generator to generate a second phase of the clock signal based on the ramp voltage at the second input of the first comparator and the reference voltage at the first input of the first comparator; and
    a ramp voltage generator configured to generate the ramp voltage, wherein the ramp voltage generator comprises:
        a single current source configured to generate a current;
        a first capacitor configured to be:
            charged by the current generated by the single current source, to generate the ramp voltage during the first phase of the clock signal; and
            discharged during the second phase of the clock signal; and
        a second capacitor configured to be:
            charged by the current generated by the single current source, to generate the ramp voltage during the second phase of the clock signal; and
            discharged during the second phase of the clock signal.

2. The apparatus of claim 1, wherein the first comparator is configured to generate the signal at the first logic level or at the second logic level in response to the ramp voltage reaching or exceeding the reference voltage.

3. The apparatus of claim 1, wherein the ramp voltage generator further comprises:
    a first switching device configured to:
        couple the current source to the first capacitor in response to the first phase of the clock signal; and
        decouple the current source from the first capacitor in response to the second phase of the clock signal;
    a second switching device configured to:
        couple terminals of the first capacitor together to discharge the first capacitor in response to the second phase of the clock signal; and
        decouple the terminals of the first capacitor from each other to allow the charging of the first capacitor in response to the first phase of the clock signal;
    a third switching device configured to:
        couple the current source to the second capacitor in response to the second phase of the clock signal; and decouple the current source from the second capacitor in response to the first phase of the clock signal; and
a fourth switching device configured to:
couple terminals of the second capacitor together to discharge the second capacitor in response to the first phase of the clock signal; and
decouple the terminals of the second capacitor from each other to allow the charging of the second capacitor in response to the second phase of the clock signal.

4. The apparatus of claim 3, wherein at least one of the first, second, third or fourth switching device is configured as a transmission gate including complementary control inputs configured to receive the clock signal and a complementary clock signal, respectively.

5. The apparatus of claim 1, further comprising:
a first switching device configured to:
route the ramp voltage from the first capacitor to the first input of the comparator in response to the first phase of the clock signal; and
decouple the first capacitor from the first input of the comparator in response to the second phase of the clock signal; and
a second switching device configured to:
route the ramp voltage from the second capacitor to the second input of the comparator in response to the second phase of the clock signal; and
decouple the second capacitor from the second input of the comparator in response to the first phase of the clock signal.

6. The apparatus of claim 5, wherein at least one of the first or second switching device comprises a transmission gate including complementary control inputs configured to receive the clock signal and a complementary clock signal, respectively.

7. The apparatus of claim 1, further comprising a reference voltage generator configured to generate the reference voltage.

8. The apparatus of claim 7, wherein the reference voltage generator comprises:
a current source configured to generate a current; and
a resistor through which the current flows, wherein the reference voltage is generated at a node between the current source and the resistor.

9. The apparatus of claim 8, wherein the reference voltage generator further comprises a capacitor coupled in parallel with at least the resistor.

10. The apparatus of claim 8, further comprising:
a first switching device configured to:
couple the node to the second input of the first comparator in response to the first phase of the clock signal; and
decouple the node from the second input of the first comparator in response to the second phase of the clock signal; and
a second switching device configured to:
couple the node to the first input of the first comparator in response to the second phase of the clock signal; and
decouple the node from the first input of the first comparator in response to the first phase of the clock signal.

11. The apparatus of claim 10, wherein at least one of the first or second switching device comprises a transmission gate including complementary control inputs configured to receive the clock signal and a complementary clock signal, respectively.

12. The apparatus of claim 1, further comprising a second comparator configured to generate an enable signal to enable the first comparator based on the ramp voltage and a threshold voltage.

13. The apparatus of claim 12, wherein the second comparator is configured to generate the enable signal in response to the ramp voltage reaching or exceeding the threshold voltage.

14. The apparatus of claim 12, further comprising a threshold voltage generator configured to generate the threshold voltage.

15. The apparatus of claim 14, wherein the threshold voltage generator comprises:
a current source configured to generate a current; and
a resistor through which the current flows, wherein the threshold voltage is based on a voltage drop across the resistor.

16. The apparatus of claim 15, wherein the threshold voltage generator comprises a capacitor coupled across at least the resistor.

17. The apparatus of claim 12, further comprising a combined threshold and reference voltage generator configured to generate the threshold voltage and the reference voltage.

18. The apparatus of claim 17, wherein the combined threshold and reference voltage generator comprises:
a current source configured to generate a current; and
first and second resistors through which the current flows, wherein the threshold voltage is based on a voltage drop across the second resistor, and wherein the reference voltage is generated at a node between the current source and the first resistor.

19. A method, comprising:
generating a ramp voltage comprising:
charging a first capacitor with a current generated by a single current source to generate the ramp voltage during the first phase of the clock signal; and
charging a second capacitor with the current generated by the single current source to generate the ramp voltage during the second phase of the clock signal;
generating a first signal based on the ramp voltage at a first node and a reference voltage at a second node;
generating a second signal based on the ramp voltage at the second node and the reference voltage at the first node;
generating a first phase of a clock signal in response to the first signal; and
generating a second phase of the clock signal in response to the second signal.

20. The method of claim 19, wherein generating the first or second signal comprises generating the first or second signal in response to the ramp voltage reaching or exceeding the reference voltage.

21. The method of claim 19, wherein generating the ramp voltage further comprises:
discharging the first capacitor during the second phase of the clock signal; and
discharging the second capacitor during the first phase of the clock signal.

22. The method of claim 19, further comprising enabling a comparison of the ramp voltage to the reference voltage to generate the first or second signal in response to the ramp voltage reaching or exceeding a threshold voltage.

23. The method of claim 22, further comprising generating the threshold voltage based on the reference voltage.

24. An apparatus, comprising:
means for generating a ramp voltage comprising:

means for coupling a current source to a first capacitor for charging the first capacitor with a current by a single current source to generate the ramp voltage during the first phase of the clock signal; and means for coupling the current source to a second capacitor for charging the second capacitor with the current generated by the single current source to generate the ramp voltage during the second phase of the clock signal;

means for generating a first signal based on the ramp voltage at a first node and a reference voltage at a second node, wherein the means for generating the first signal is configured to generate a second signal based on the ramp voltage at the second node and the reference voltage at the first node; and means for generating a first phase of a clock signal in response to the first signal, wherein the means for generating the first phase of the clock signal is configured to generate a second phase of the clock signal in response to the second signal.

25. The apparatus of claim 24, wherein means for generating the first and second signals comprises means for generating the first and second signals in response to the ramp voltage reaching or exceeding the reference voltage.

26. The apparatus of claim 24, further comprising:
means for discharging the first capacitor during the second phase of the clock signal; and
means for discharging the second capacitor during the first phase of the clock signal.

27. The apparatus of claim 24, further comprising means for enabling the means for generating the first and second signals in response to the ramp voltage reaching or exceeding a threshold voltage.

28. The apparatus of claim 27, further comprising means for generating the threshold voltage based on the reference voltage.

* * * * *